(12) United States Patent
Ueda

(10) Patent No.: US 9,297,840 B2
(45) Date of Patent: Mar. 29, 2016

(54) POWER DETECTION CIRCUIT

(75) Inventor: Kazuhiro Ueda, Yokohama (JP)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 237 days.

(21) Appl. No.: 13/612,516

(22) Filed: Sep. 12, 2012

(65) Prior Publication Data

US 2013/0154665 A1  Jun. 20, 2013

(30) Foreign Application Priority Data

Dec. 15, 2011 (JP) ................. 2011-275015

(51) Int. Cl.
  *G01R 35/00* (2006.01)
  *G01R 21/00* (2006.01)
  *H03D 1/10* (2006.01)
  *G01R 21/01* (2006.01)
  *G01R 21/12* (2006.01)

(52) U.S. Cl.
  CPC ............... *G01R 21/00* (2013.01); *G01R 21/01* (2013.01); *G01R 21/12* (2013.01); *H03D 1/10* (2013.01)

(58) Field of Classification Search
  CPC ....... G01R 35/005; G01R 27/28; G01R 27/32
  USPC .................... 324/74, 202, 601, 619; 330/140; 329/365, 366
  See application file for complete search history.

(56) References Cited

U.S. PATENT DOCUMENTS

| | | | | |
|---|---|---|---|---|
| 4,376,266 A | * | 3/1983 | Raffoux ................. | G01R 19/04 324/426 |
| 4,737,730 A | | 4/1988 | Ishiwata et al. | |
| 4,810,950 A | * | 3/1989 | Young ................... | G01R 27/28 324/603 |
| 5,083,080 A | * | 1/1992 | Tagiri .................... | G01R 27/28 324/115 |
| 5,319,804 A | | 6/1994 | Matsumoto et al. | |
| 5,811,984 A | * | 9/1998 | Long .............. | H03K 19/018557 326/30 |
| 6,265,940 B1 | | 7/2001 | Adachi | |
| 6,397,160 B1 | * | 5/2002 | Craig ................. | G01R 31/2822 324/142 |

(Continued)

FOREIGN PATENT DOCUMENTS

| | | |
|---|---|---|
| CN | 201307137 Y | 9/2009 |
| JP | 58-147309 U | 10/1983 |

(Continued)

OTHER PUBLICATIONS

Office Action issued in Japanese Patent Application No. 2011-275015 dated Feb. 18, 2014.

(Continued)

*Primary Examiner* — Tung X Nguyen
*Assistant Examiner* — Dominic Hawkins
(74) *Attorney, Agent, or Firm* — NSIP Law

(57) ABSTRACT

There is provided a power detection circuit capable of appropriately adjusting detection voltage characteristics by using simple configuration. The power detection circuit includes a first resistor having current applied thereto to adjust a detection voltage value of input power, an element having an applied voltage and a load characteristic changed according to the input power, and a second resistor connected to the element and having current applied thereto when resistance of the element becomes relatively low, to adjust the detection voltage value of the input power. Detection voltage characteristics may be appropriately adjusted using a simple configuration.

4 Claims, 5 Drawing Sheets

(56) References Cited

U.S. PATENT DOCUMENTS

| | | | | |
|---|---|---|---|---|
| 6,486,647 | B1* | 11/2002 | Obrecht | H01H 9/167 324/676 |
| 6,639,433 | B1* | 10/2003 | Heckenbach | H03K 17/005 327/108 |
| 6,710,716 | B1* | 3/2004 | Abe | H03D 1/18 330/277 |
| 7,026,807 | B2* | 4/2006 | Anderson | G01R 35/005 324/130 |
| 8,198,936 | B2* | 6/2012 | Matsuzaki | H04L 27/06 329/340 |
| 2004/0041573 | A1* | 3/2004 | Klemm | G01R 19/0084 324/713 |
| 2005/0207250 | A1* | 9/2005 | Kang | G11C 11/22 365/207 |
| 2008/0106539 | A1* | 5/2008 | Le | G09G 3/3406 345/211 |
| 2008/0211479 | A1* | 9/2008 | Anderson | H02J 9/061 324/76.11 |
| 2008/0231367 | A1* | 9/2008 | Shigematsu | H03F 1/56 330/277 |
| 2010/0013523 | A1* | 1/2010 | Kuwahara | H03F 1/0261 327/108 |
| 2010/0225304 | A1* | 9/2010 | Wynne | G01R 19/0084 324/126 |
| 2011/0101940 | A1* | 5/2011 | Kudo | H02M 3/1584 323/282 |
| 2012/0113689 | A1* | 5/2012 | Chen | H02M 3/33523 363/21.17 |

FOREIGN PATENT DOCUMENTS

| | | |
|---|---|---|
| JP | 60-148205 A | 8/1985 |
| JP | 62-20380 U | 2/1987 |
| JP | 2-141109 U | 11/1990 |
| JP | 3-258121 A | 11/1991 |
| JP | 5-29967 A | 2/1993 |
| JP | 2001-203536 A | 7/2001 |

OTHER PUBLICATIONS

Korean Office Action issued in Korean Application No. 10-2012-0032420 dated Jul. 7, 2014.

Chinese Office Action dated Jan. 14, 2015, issued in connection with corresponding Chinese Patent Application No. 201210360846.7. (with English translation).

* cited by examiner

POWER DETECTION CIRCUIT

CROSS-REFERENCE TO RELATED APPLICATIONS

This application claims the priority of Japanese Patent Application No. 2011-275015 filed on Dec. 15, 2011, in the Japan Patent Office, the disclosure of which is incorporated herein by reference.

BACKGROUND OF THE INVENTION

1. Field of the Invention

The present invention relates to a power detection circuit.

2. Description of the Related Art

An output power detection circuit has recently been used in a wide variety of devices. For example, since a wireless communication terminal, or the like, communicates using an optimal output power at the time of communication with a base station or an access point, an output power detection circuit is essential.

For example, in the following Related Art Document, Patent Document 1 has disclosed a detection circuit having a configuration in which a resistance value is changed according to a level of power input to a detection diode. In addition, the following Patent Document 2 has disclosed a detection circuit having a configuration in which a diode and a resistor are connected in parallel with a capacitor.

However, in the detection circuit, characteristics of a detection voltage for input power exponentially increase as the input power increases. The detection voltage detected in the detection circuit is transmitted to a processing circuit, but a voltage value supplied to the processing circuit is limited. Therefore, it is expected that the detection voltage at a high input power side will exceed the limited value. Also in FIG. 3 of Patent Document 1, since both an input power and a rectifying voltage are represented by a logarithm, in the case in which the rectifying voltage is represented by a real number, the rectifying voltage exponentially increases with respect to the input power. Therefore, it is expected that the detection voltage will become excessively high at the high input power side.

In addition, Patent Document 2 has disclosed a configuration in which a resistance value of a resistor 14 is set to be larger than that of a resistor 19 so that voltage appearing at a detection voltage output terminal 16 at the time of detection is not changed according to a temperature change (please see FIG. 1). However, Patent Document 2 has only disclosed a configuration for compensating for temperature characteristics, but it cannot be expected that characteristics of the detection voltage with respect to the input power are appropriately adjusted.

RELATED ART DOCUMENT (Patent Document 1) Japanese Patent Laid-Open Publication No. 1991-258121

(Patent Document 2) Japanese Patent Laid-Open Publication No. 2001-203536

SUMMARY OF THE INVENTION

An aspect of the present invention provides a power detection circuit capable of appropriately adjusting characteristics of a detection voltage using a simple configuration.

According to an aspect of the present invention, there is provided a power detection circuit including: a first resistor having current applied thereto to adjust a detection voltage value of input power; an element having an applied voltage and a load characteristic, changed according to the input power; and a second resistor connected to the element and having current applied thereto when resistance of the element becomes relatively low to adjust the detection voltage value of the input power.

According to the configuration as described above, when the input voltage is relatively low, voltage applied to the element becomes relatively low and resistance of the element becomes relatively high, such that the detection voltage may be adjusted by the first resistor. Further, when the input voltage is relatively high, voltage applied to the element becomes relatively high and resistance of the element becomes relatively low, such that the detection voltage may be adjusted by the first and second resistors. Therefore, the detection voltage may be appropriately adjusted within the entire range of the input power.

The element may be formed of a diode. According to the configuration as described above, the element in which voltage applied to the diode becomes low and resistance of the diode becomes high in the case in which the input power is low, and the voltage applied to the diode becomes high and the resistance of the diode becomes low in the case in which the input power is high, such that a load characteristic is changed according to the power, may be configured.

The element may have the load characteristic changed according to feedback of the detection voltage value. According to the configuration as described above, since the load characteristic of the element is changed according to the feedback of the detection voltage value, a change in the load may be more precisely controlled and the characteristics of the detection voltage may be more precisely adjusted.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Figure 1:
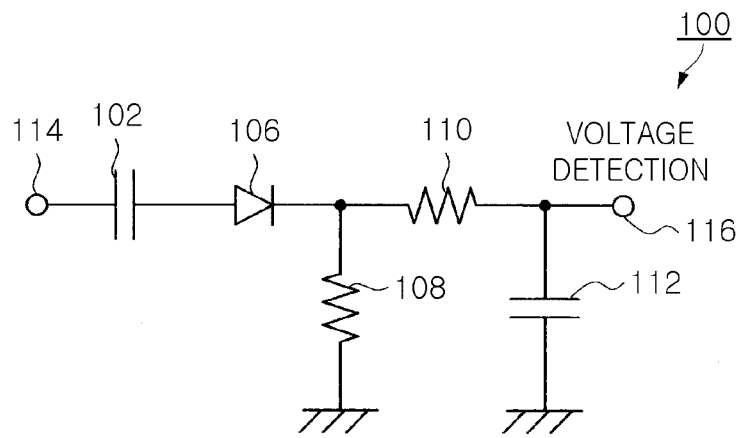
FIG. 1 is a diagram illustrating a basic circuit of a power detection circuit provided according to an embodiment of the present invention.

Hereinafter, embodiments of the present invention will be described in detail with reference to the accompanying drawings. Meanwhile, like reference numerals designate like components having substantially the same constitution and func- <1. Embodiment>

FIG. 1 is a diagram illustrating a basic circuit of a power detection circuit 100 provided according to an embodiment of the present invention. The circuit shown in FIG. 1 may include a condenser 102, a diode 106, a resistor 108, a resistor 110, a condenser 112, an input terminal 114, and an output terminal 116.

In the circuit as shown in FIG. 1, a target input power (an RF amplitude) to be detected may be input to the input terminal 114. DC components of the input power may be cut by the condenser 102. The input power may be rectified in the diode 106 and RF components of the input power may be cut in the resistor 110 and the condenser 112, such that characteristics of the input power may be flatted and output through the output terminal 116.

Figure 2:
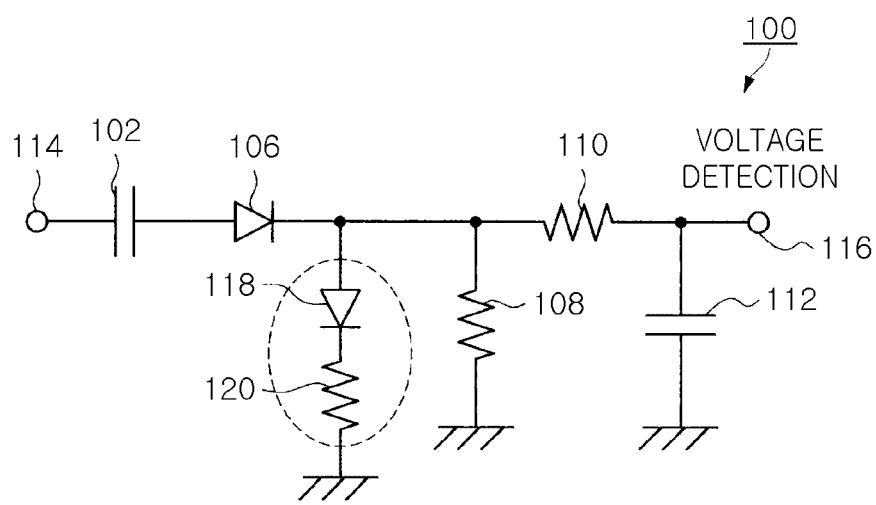
FIG. 2 is a diagram illustrating a configuration of the power detection circuit according to the embodiment of the present invention.

FIG. 2 is a diagram illustrating a configuration of the power detection circuit 100 according to the embodiment of the present invention. The power detection circuit 100 as shown in FIG. 2 further includes a diode 118 and a resistor 120 connected in series with each other, connected in parallel with the resistor 108, and grounded, in addition to the components of the circuit of FIG. 1. Meanwhile, although a forward half-wave rectifying circuit has been used as the power detection circuit according to the embodiment of the present invention, the present invention is not limited thereto. That is, a double voltage rectifying circuit, a bridge rectifying circuit, a voltage applying type rectifying circuit, or the like, may be used as the power detection circuit according to the embodiment of the present invention.

The diode 106, the resistor 108, and the resistor 110 may be elements configuring a main unit of the power detection circuit 100 according to the embodiment of the present invention. The diode 118 may be formed of an element in which a load characteristic is changed according to voltage.

Figure 3:
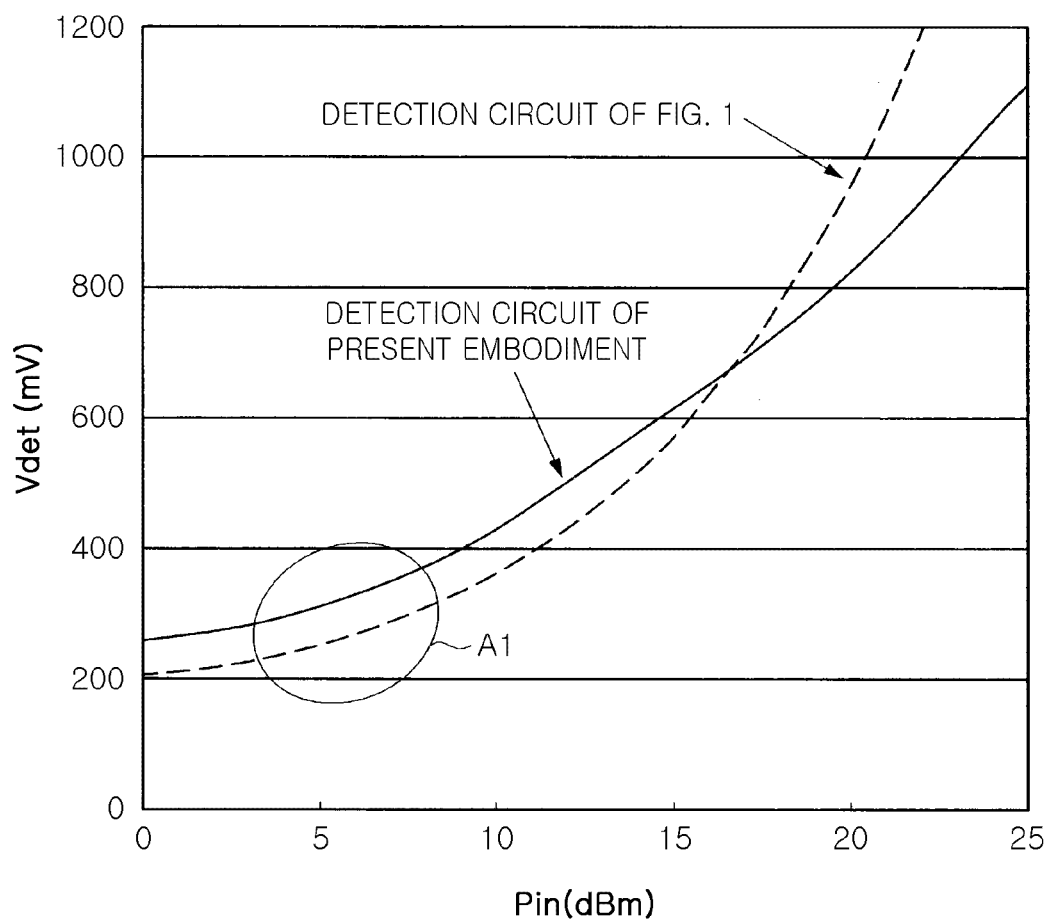
FIG. 3 is a characteristic diagram illustrating detection characteristics of the circuit of FIG. 1 and the power detection circuit of FIG. 2.

FIG. 3 is a characteristic diagram illustrating detection characteristics of the circuit of FIG. 1 and the power detection circuit of FIG. 2, wherein a horizontal axis represents power Pin input to the input terminal 114 by a logarithm and a vertical axis represents detection result voltage (detection voltage) output from the output terminal 116 by a real number. In addition, in FIG. 3, a dotted line represents a detection characteristic of the circuit of FIG. 1, and a solid line represents a detection characteristic of the circuit of FIG. 2.

In the case of the circuit of FIG. 1, the detection voltage value may be set by the resistor 108 which is grounded in a predetermined ratio regardless of high frequency power Pin input to the input terminal 114. Therefore, the detection voltage may be rapidly increased in accordance with an increase in the power Pin. That is, since current rectified in the diode 106 flows in the resistor 108, but the current flowing in the resistor 108 is changed according to the power Pin, a gradient of the detection characteristic may be exponentially increased in accordance with the increase in the power Pin. Since an upper limit value of the detection voltage which may be supplied is preset, particularly, in the case in which the power Pin is relatively high, the detection voltage becomes larger than the upper limit value, such that the voltage may not be detected. Therefore, in the circuit of FIG. 1, the detection voltage is suppressed in the case in which the power Pin is relatively high, such that the gradient of the detection characteristic in the case in which the power Pin is relatively low may be decreased and detection sensitivity may be deteriorated.

On the other hand, in the power detection circuit 100 according to the embodiment of the present invention, voltage applied to the diode 118 may be changed and a load characteristic of the diode 118 may be changed, according to power of the power Pin input to the input terminal 114. Therefore, in the case in which the power Pin is relatively low and the diode 118 has relatively high resistance, the detection voltage may be adjusted by a parallel resistor (resistor 108). In addition, in accordance with the increase in the power Pin input to the input terminal 114, the resistance of the diode 118 becomes low and the load characteristic of an element including the diode 118 and the resistor 120 decreases, such that a portion of current output from the diode 106 may flow to the diode 118 and the resistor 120. Therefore, in the case in which the power Pin is high, the detection voltage value may be adjusted according to values of the resistor 120 and the resistor 108.

In other words, in the case in which the power Pin is high, the resistance of the diode 118 becomes low and the diode 118 and the resistor 120 are connected in parallel with the resistor 108, such that a resistance value may become low and potential may be suppressed to be low, as compared to the circuit of FIG. 1. Therefore, in a region in which the power Pin is high, the gradient of the detection characteristic may also be suppressed. Therefore, even in the case in which the power Pin is relatively high, the detection may be surely performed without exceeding a measurable upper limit value by the detection result voltage.

Therefore, the power detection circuit 100 according to the embodiment of the present invention may adjust the values of the resistor 120 and the resistor 108, thereby adjusting the gradient of the detection characteristic. In an example shown in FIG. 3, the values of the resistor 120 and the resistor 108 are adjusted so that the gradient of the detection characteristic is suppressed at a high power side and the gradient of the detection characteristics of the solid line become larger than that of the dotted line in a region A1. Therefore, since the detection result voltage is changed by an amplitude of the power Pin even in the region in which the power is relatively low, the power value may be surely detected. Therefore, since a detection voltage detection value on a vertical axis may be more largely changed with respect to the change in the power Pin, detection performance may be improved even in the region in which the power Pin is relatively low.

In addition, in the solid line shown in FIG. 3, the detection characteristic is represented by an approximately straight line in the region in which the value of the power Pin is intermediate. As described above, the values of the resistor 120 and the resistor 108 may be appropriately adjusted, thereby allowing for the detection characteristic to be linear.

As described above, with the power detection circuit 100 of FIG. 2, as compared to the circuit of FIG. 1, the gradient of the detection characteristic may be suppressed in the region in which the power Pin is relatively large and the gradient of the detection characteristic may be increased in the region in which the power Pin is relatively low. Therefore, the detection voltage may be detected more precisely as compared to the circuit of FIG. 1.

Figure 4:
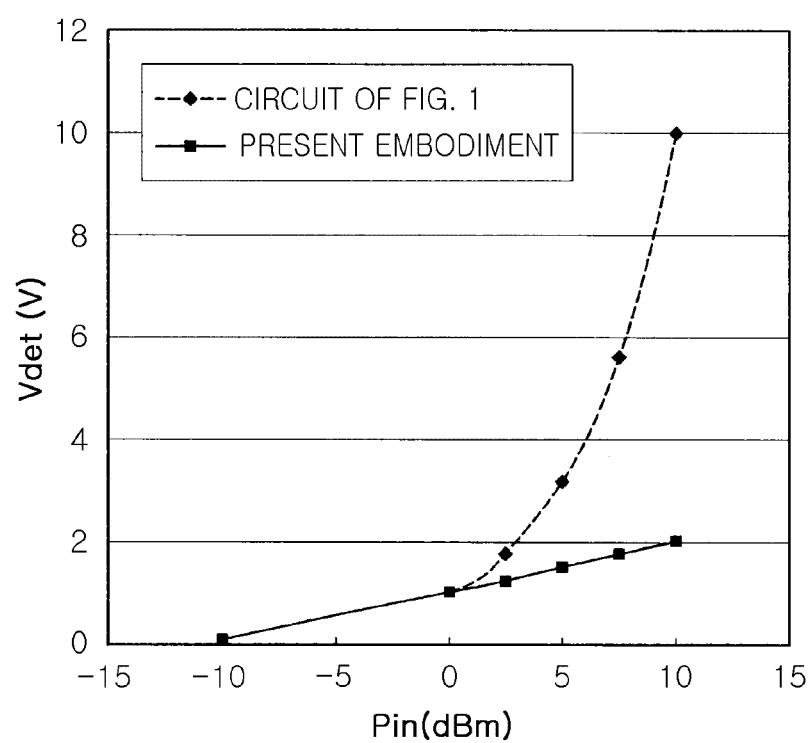
FIG. 4 is a characteristic diagram illustrating another example describing a difference between detection characteristics of the circuit of FIG. 1 and the power detection circuit of FIG. 2 in detail.
Figure 5:
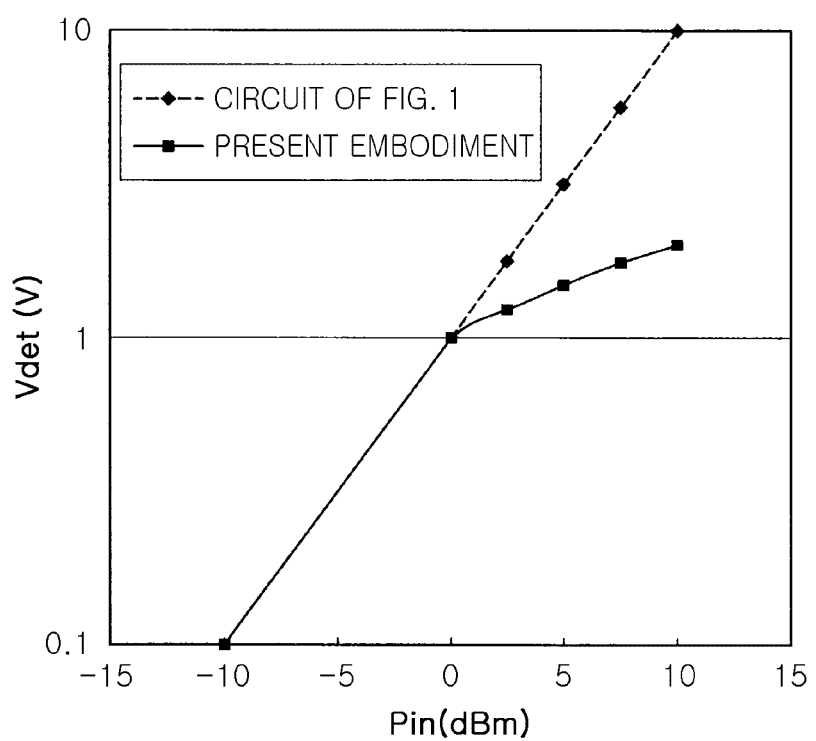
FIG. 5 is a characteristic diagram in which a vertical axis of FIG. 4 is represented by a logarithm.

FIGS. 4 and 5 are characteristic diagrams illustrating another example describing a difference between detection characteristics of the circuit of FIG. 1 and the power detection circuit of FIG. 2 in detail. Similar to FIG. 3, a horizontal axis of FIG. 4 represents power Pin of high frequency input to the input terminal 114, and a vertical axis thereof represents detection voltage. In addition, FIG. 5 is a characteristic diagram in which the vertical axis of FIG. 4 is represented by a logarithm. Also in FIGS. 4 and 5, a dotted line represents a detection characteristic of the circuit of FIG. 1 and a solid line represents a detection characteristic of the power detection circuit 100 of FIG. 2.

Also in examples shown in FIGS. 4 and 5, a value of the detection voltage may be suppressed particularly at a high power side. In addition, values of the resistor 120 and the resistor 108 may be appropriately adjusted, thereby allowing for the gradient of detection characteristics in FIG. 4 to be linear.

As described above, according to the embodiment of the present invention, the element is configured by connecting the diode 118 and the resistor 120 in series with each other, the diode 118 and the resistor 120 having the load characteristic changed according to the power Pin, and the element configured above and the resistor 108 are then connected in parallel with each other. Therefore, the detection voltage value may be adjusted by the resistor 108 at the low power side and be adjusted by the resistor 120 (and the resistor 108) at high power side. Therefore, detection voltage characteristics of the power Pin may be appropriately adjusted.

<Further Embodiment>

Figure 6:
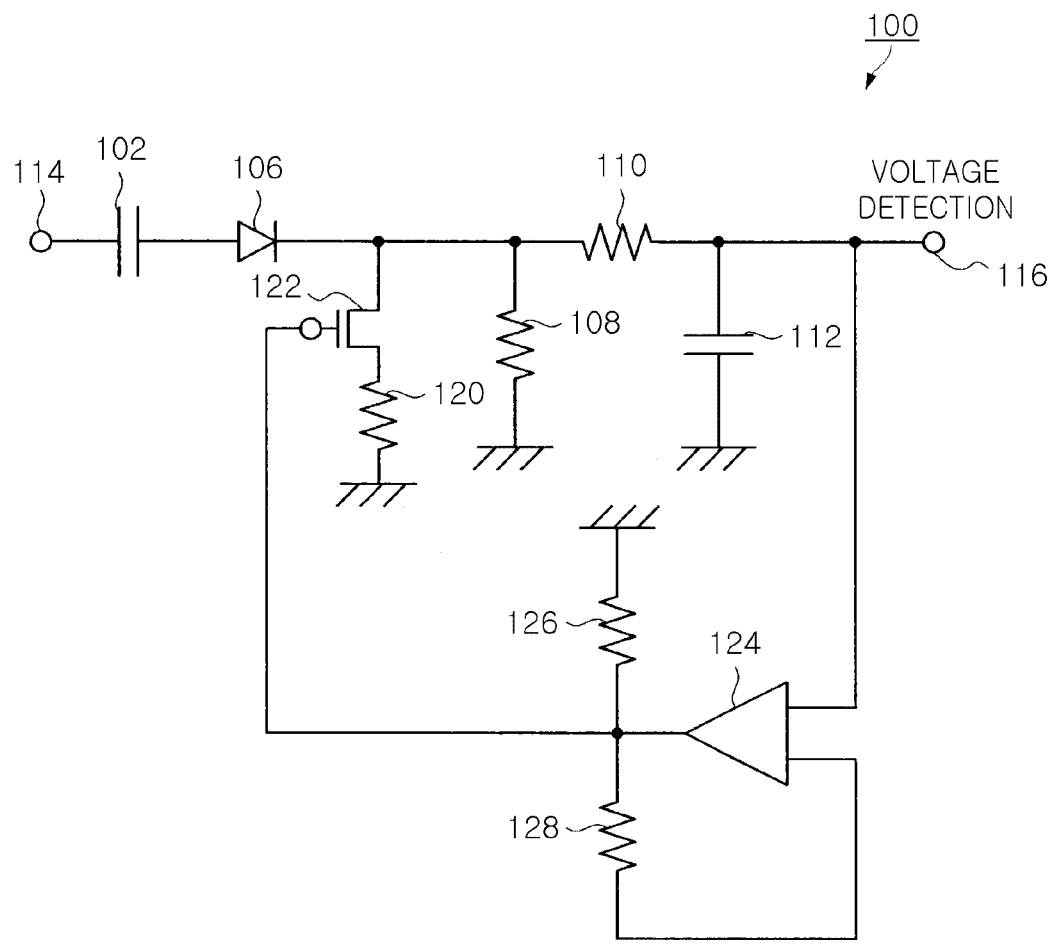
FIG. 6 is a diagram illustrating a configuration of a power detection circuit according to another embodiment of the present invention.

Next, another embodiment of the present invention will be described. FIG. 6 is a diagram illustrating a configuration of a power detection circuit 100 according to another embodiment of the present invention. As shown in FIG. 6, according to another embodiment of the present invention, a transistor 122 may be disposed instead of the diode 118. In addition, a detection voltage at an output terminal 116 may be input to an operational amplifier 124, and a coefficient of detection voltage is multiplied according to a voltage division ratio between a resistor 126 and a resistor 128 and then input to a gate of the transistor 122.

According to the above-mentioned configuration, since a load characteristic of the transistor 122 is changed according to a detection voltage value, in the case in which the power Pin is low, resistance of the transistor 122 becomes high, such that the detection voltage value may be adjusted by the resistor 108.

In addition, in the case in which the power Pin is high, the resistance of the transistor 122 becomes low, such that the detection voltage value may be adjusted by the resistor 120 (and the resistor 108). Therefore, similar to the embodiment of the present invention, detection voltage characteristics of the power Pin may be appropriately adjusted.

In addition, since the load of the transistor 122 may be controlled by feeding-back the detection voltage in another embodiment of the present invention, the change in the load may be controlled more precisely, as compared to the embodiment of the present invention in which the load is changed by the characteristics of the diode 118 itself. Therefore, the detection voltage characteristics of the power Pin may be adjusted more freely and more precisely.

As described above, according to another embodiment of the present invention, since the load characteristic of the transistor 122 is changed according to the detection voltage value, in the case in which the power Pin is low, the resistance of the transistor 122 becomes relatively high, such that the detection voltage value may be adjusted by the resistor 108. In addition, as the power Pin becomes relatively high, the resistance of the transistor 122 becomes relatively low, such that the detection voltage value may be adjusted by the resistor 120 (and the resistor 108). Therefore, similar to the embodiment of the present invention, detection voltage characteristics of the power Pin may be appropriately adjusted.

As set forth above, according to the embodiment of the present invention, the power detection circuit capable of appropriately adjusting the characteristics of the detection voltage using the simple configuration can be provided.

While the present invention has been shown and described in connection with the embodiments, it will be apparent to those skilled in the art that modifications and variations can be made without departing from the spirit and scope of the invention as defined by the appended claims.

What is claimed is:

1. A power detection circuit comprising:
a first resistor having current applied thereto to adjust a detection voltage value of input power;
an element having an applied voltage changed according to the input power; and
a second resistor connected to the element and having current applied thereto when resistance of the element becomes relatively low to adjust the detection voltage value of the input power,
wherein resistance of the element changes according to feedback of detection voltage value inputted to the element, thereby changing in inverse proportion to the input power, and
wherein the element comprises a transistor having a gate coupled via an operational amplifier to an output of the power detection circuit.

2. The power detection circuit of claim 1, wherein the second resistor is connected in series with the element, and the first resistor is coupled in parallel with the series connection of the second resistor and the element.

3. The power detection circuit of claim 2, wherein the series connection of the second resistor and the element is connected between a signal node and ground node, and the first resistor is coupled in parallel with the series connection of the second resistor and the element between the signal node and the ground node.

4. The power detection circuit of claim 1, wherein the second resistor is connected in series with the drain and source terminals of the transistor, and the first resistor is coupled in parallel with series connection of the second resistor and the transistor.

* * * * *